United States Patent [19]

Day et al.

[11] Patent Number: 4,806,995

[45] Date of Patent: Feb. 21, 1989

[54] OPTICAL AND ELECTRICAL SWITCHING DEVICES AND A POLYMER COMPOSITION CONTAINING PENDANT ORGANIC CHARGE TRANSFER SALT MOIETIES USEFUL IN SWITCHING DEVICES

[75] Inventors: Roger W. Day, Cheshire; Michael J. Morgan, Northford, both of Conn.

[73] Assignee: Olin Corporation, Cheshire, Conn.

[21] Appl. No.: 9,854

[22] Filed: Feb. 2, 1987

[51] Int. Cl.[4] ............................................. H01L 29/28
[52] U.S. Cl. .................................... 357/8; 346/76 L;
  357/1; 357/2; 357/30; 365/153
[58] Field of Search ......................... 357/8, 1, 2, 30 R;
  346/76 L; 365/153; 430/19, 270

[56] References Cited

U.S. PATENT DOCUMENTS

| | | | |
|---|---|---|---|
| 4,371,883 | 2/1983 | Potember et al. | 357/8 |
| 4,507,672 | 3/1985 | Potember et al. | 357/8 |
| 4,574,366 | 3/1986 | Potember et al. | 365/153 |
| 4,622,170 | 11/1986 | Wynne et al. | 252/518 |
| 4,728,724 | 3/1988 | Jones, Jr. et al. | 346/76 L |
| 4,731,756 | 3/1988 | Potember et al. | 365/153 |

OTHER PUBLICATIONS

Hoshino et al, "Reversibly Write-Erase Properties of CuTCNQ Optical Recording Media", *Japanese Journal of Applied Physics,* Part 2, 25, (4), L341 (1986).

R. W. Day et al, "Synthesis of Aliphatic Polyesters Containing Tetracyanoquinodimethane Units by Low-Temperature Polycondensation Reactions", *Journal of Polymer Science*: Part A: Polymer Chemistry, vol. 24, 645–654 (1986).

*Primary Examiner*—Andrew J. James
*Assistant Examiner*—Sara W. Crane
*Attorney, Agent, or Firm*—Dale Lynn Carlson

[57] ABSTRACT

This invention pertains to optical and electrical switching devices and to novel polymers containing pendant organic charge transfer moieties and useful in the fabrication of the switching devices.

5 Claims, No Drawings

OPTICAL AND ELECTRICAL SWITCHING DEVICES AND A POLYMER COMPOSITION CONTAINING PENDANT ORGANIC CHARGE TRANSFER SALT MOIETIES USEFUL IN SWITCHING DEVICES

FIELD OF THE INVENTION

This invention relates generally to optical and electrical switching devices and to novel polymers containing pendant organic charge transfer salts. These polymers are useful as erasable and/or permanent optical storage media in the fabrication of threshold or memory electrical, optical or optoelectronic switches.

BACKGROUND OF THE INVENTION

In the field of optical and electrical switching, the prior art recognized the use of organic thin films as switching media. Impedance changes which accompany this switching are known to be associated with molecular motion due to Joule heating which results in either crystallization phase transitions, metal filament formation, or elimination of compositional disorder. Switching has also been related to electrical breakdown of the organic thin film due to weak spots in the switching material.

Switching by means of electrochemical changes in the switching media has also been disclosed. By way of illustration, switching due to electrochemical changes in a charge transfer salt, e.g., a metal complexed with tetracyanoquinodimethane (TCNQ), tetracyanonaphthoquinodimethane (TNAP), tetracyanoethylene (TCNE), dichlorodicyanobenzoquinone (DDQ), or TCNQ derivatives is disclosed in U.S. Pat. Nos. 4,574,336; 4,507,672; and 4,371,883, the disclosures of each of these three patents being incorporated herein by reference. The TCNQ and TCNQ derivative materials employed for switching in these three patents are disclosed therein as providing good nanosecond time interval switching. However, it has more recently been found that TCNQ or derivative localized migration or diffusion tends to occur in the region of current flow or laser beam contact upon repeated switching, thereby diminishing the useful lifespan of these devices.

At least one attempt has been made to minimize this migration or diffusion problem. Specifically, Hoshino et al, "Reversibly Write-Erase Properties of CuTCNQ Optical Recording Media", *Japanese Journal of Applied Physics*, Part 2, 25 (4), L341 (1986), discloses achieving about 50 write-erase cycles by applying a zinc sulfide protective layer over a CuTCNQ film prior to initiating the write-erase cycles using a semiconductor laser. This number of cycles is expected to be insufficient for most practical applications.

The rapidly evolving technology of optical data storage has the potential to retain unprecedented amounts of information at high density using optically focused beams. In a commercial setting, it would be highly desirable to provide switching media characterized by excellent physical properties and the ability to provide repeated cycles while lending itself to economical fabrication techniques. A typical application would be for random access memory storage devices. Organic materials such as TCNQ have the potential for providing these characteristics if the above-discussed migration or diffusion problem is obviated. Accordingly, the solution to this migration or diffusion problem would be highly desirable.

SUMMARY OF THE INVENTION

In one aspect, the present invention relates to a novel polymer containing pendant organic charge transfer salt moieties. This polymer has a switching capability in response to optical radiation or electrical current. This switching capability is provided by the charge transfer salt moieties characteristic of possessing a first charge state having a relatively high electrical impedance and a second charge state having a relatively lower electrical impedance. The polymer preferably has the following empirical structural formula:

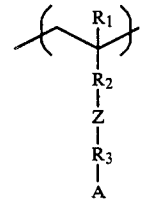

wherein
$R_1 = H$ or $CH_3$,
$R_2$ and $R_3$ are the same or different organic radical or substituted organic radical linking groups having up to 6 carbon atoms, and
$Z =$

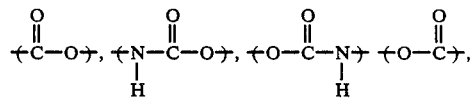

and wherein A is selected from the group consisting of TCNQ and derivatives thereof, tetracyanonaphthoquinodimethane (TNAP) or derivatives thereof, and tetracyanoanthraquinodimethane (TCNA) or derivatives thereof.

In a more preferred aspect
$A =$

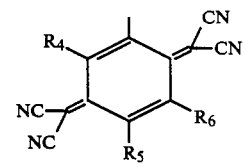

wherein $R_4$, $R_5$, and $R_6$ are the same or different groups preferably selected from the group consisting of hydrogen, bromine, iodine, chlorine, fluorine, alkyl, and alkoxy groups having up to 6 carbon atoms, and the like. Illustrative of suitable such groups are —OEt, —Cl, —Me, —H, —CN, —Br, -isopropyl, and isopropoxy.

In another aspect, the present invention relates to a switching device, responsive to an electrical field, comprising:
(a) a polymer containing an organic charge transfer salt wherein the salt comprises a polymer-bound organic electron acceptor and an electrostatically-bound electron donor, and
(b) a source of the electrical field.

DETAILED DESCRIPTION OF THE INVENTION

The polymer composition of the present invention is characterized by stability against diffusion or migration of the charge transfer groups out of the polymer during switching of these charge transfer groups from a relatively lower impedance state to a relatively higher impedance state and vice versa in response to an electrical field produced by optical radiation or current flow through localized portions of the polymer composition. This stability insures that the polymer will retain its switching capability after repeated switching cycles without encountering the rapidly diminished effectiveness experienced by organic charge transfer salts of the prior art.

Without wishing to be bound by any particular theory, the efficacy of the compositions of the present invention in preventing diffusion or migration of the organic charge transfer groups contained therein out of the polymer is believed by the present inventors to be attributable to the binding influence of the polymer on the charge transfer groups in the composition. Moreover, in the preferred compositions of the invention containing pendantly-bound charge transfer groups, the efficacy of the polymer-bound charge transfer groups in providing both threshold and memory switching capability is believed by the inventor to be attributable, at least in part, to the structural alignment and accessability associated with the pendant binding of the charge transfer groups. In regard to structural alignment, the pendantly-bound charge transfer groups are believed by the present inventors to promote cofacial stacking of the TCNQ molecules, thereby enhancing the desired switching properties of the polymer. Such a stacking array is known to be useful for providing good conduction in electroconductive devices as generally discussed in U.S. Pat. No. 4,622,170, incorporated herein by reference.

The organic charge transfer moieties useful in preparing the compositions employed in the switching device of the present invention generally have one or two functional groups suitable as a polymer-bonding site. Two functional groups per molecule are utilized if it is desired to incorporate the charge transfer moiety into the polymer backbone, whereas one functional group is frequently used to provide a site for pendant attachment in the polymer. However, as in the case of step-growth polymerization described below, two functional groups per molecule may be employed to provide a polymer with pendant charge transfer groups. The functional group is suitably —OH, —COOCH$_3$, —COOCH$_2$CH$_3$, —COCl, or the like, other illustrative examples being given hereinbelow. Useful charge transfer groups include the silver, copper, and cerium salts of TCNE, TCNQ, DDQ, TNAP, and derivatives of TCNQ, and the like. The latter are suitably derivatized to contain a functional group(s) so that they may be covalently attached or ionically bonded or strongly adsorbed in the polymer. Preferred charge transfer groups are: 2-(2'-hydroxyethoxy)-5-bromo-7,7,8,8-tetracyanoquinodimethane, 3-TCNQ-propanoic acid, and 3-TCNQ propanoyl chloride, or esters of these compounds.

The preferred polymers containing pendant organic charge transfer moieties can be prepared by one of two major pathways: (a) polymerization of a preformed pendant TCNQ monomer or (b) attachment of a monofunctional reactive TCNQ derivative to an already preformed polymer molecule. Because of the well-known tendency of TCNQ to stabilize radicals and anions, free radical and anionic polymerizations involving TCNQ monomers would probably not result in the desired products. Likewise, cationic polymerization would be expected to yield products other than the desired polymers unless extreme care was used in selecting monomers whose vinyl groups would not be oxidized on exposure to TCNQ units. Therefore, this method of forming TCNQ polymers is not preferred, although it can be utilized. Step growth polymerizations of appropriate monomers is an alternate approach to forming polymers of the type described herein. Examples of suitable monomers for cationic and step growth polymerizations are given below.

The structures illustrated below are merely representative of the types of compounds that could be used:

Step Growth polymerizations:

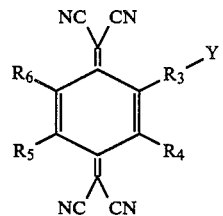

For subsequent pendant attachment to preformed polymers, a TCNQ derivative with one reactive functional group and a polymer with pendant functionality reactive functional group on the TCNQ derivative is required. The structures of possible polymers are represented below:

(a) Polymers with a pendant functional group:

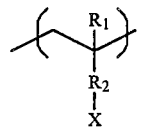

where X is typically:

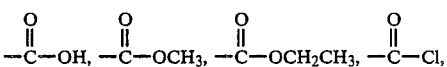

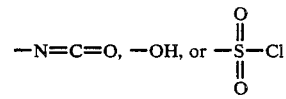

and where $R_1$ and $R_2$ are organic radicals as defined above.

(b) TCNQ derivative with functional group:

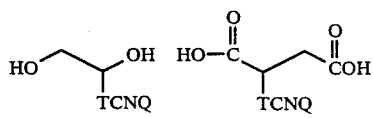

-continued

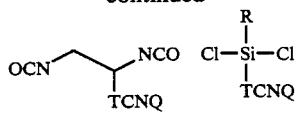

where $R_3$, $R_4$, and $R_5$ can be any of a variety of substituents as defined earlier herein; and Y is typically:

—$CO_2H$
—NCO
—$SO_2Cl$
—COCl
—$CO_2CH_3$
—OH
—$CO_2CH_2CH_3$.

The resulting polymer structures from reaction of (a) with (b) are given schematically below,

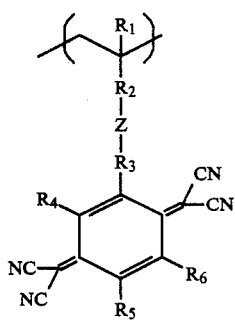

wherein Z is typically:

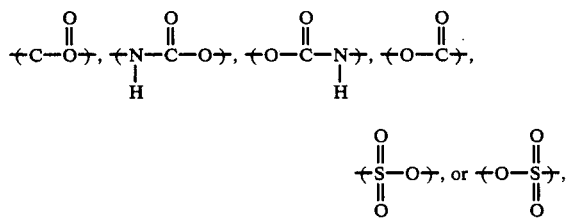

and wherein $R_1$, $R_2$, $R_3$, $R_4$, $R_5$, and $R_6$ are each defined hereinabove.

As stated above, the organic charge transfer groups are preferably pendantly bonded to the polymer in the compositions of the present invention, although backbone bonding of the organic charge transfer groups is also expected to provide polymers useful in the switching devices of the present invention. Polymers with backbone-bound change transfer groups are suitably prepared by known procedures (see, for example, "Synthesis of Aliphatic Polyesters Containing Tetracyanoquinodimethane Units by Low-Temperature Polycondensation Reactions", R. W. Day et al, *Journal of Polymer Science:* Part A: Polymer Chemistry, Vol. 24, 645–654 (1986). Bonding of the pendant groups in the polymer can be in the form of ionic bonding, covalent bonding, or merely strong adsorptive forces. Although all of these forms can be used, the TCNQ migration or diffusion problem is minimized by providing a strong attachment of the organic charge transfer groups to the polymer and, for this reason, covalent bonding is most preferred, with ionic bonding being next preferred as discussed in more detail in U.S. Pat. No. 4,622,170 (referred to above) at Column 3 thereof.

Typically, bonding of the TCNQ or derivative to the polymer is effected prior to forming the metal (silver, copper, or cerium) salt thereof. A preferred method of salt formation is to first react the TCNQ polymer with lithium iodide to form the lithium salt, and then displace the lithium with the desired silver, copper, or cerium ion. This displacement method is disclosed in Melby et al, *J.A.C.S.*, Vol. 84, p. 3374 (1962). Other well-known methods can alternately be used, such as direct reaction with metal salts such as iodides or reaction with metal itself.

The base polymer used to bind pendant organic charge transfer groups in the polymer composition of the invention can be any of a wide variety of polymers. The polymer containing the organic charge transfer group, whether this latter moiety is pendant-bound or backbone-bound, should have a melting point above the operating temperature employed in using the composition (e.g., during erasure of a switched state), preferably a melting point of at least 220° C. Although the molecular weight of these various polymers can vary over a wide range, the polymers containing pendant-bound organic charge transfer groups can have molecular weights as high as 500,000 to 3,000,000, whereas those polymers prepared by the step-growth polymerization and those with backbone-bound organic charge transfer groups can have molecular weights as low as 3,000 to 40,000. Many of these polymers are expected to be soluble in organic solvents such as DMF, DMSO, and THF, thereby facilitating easy spin coating of the polymer in solvent onto a substrate. The polymer generally does not contain any moiety reactive with the charge transfer group since any such reactivity is expected to diminish the overall efficacy of the charge transfer groups present in the composition. For example, amine-containing polymers are not desired when the charge transfer group is TCNQ since amines tend to react with TCNQ.

Typically, in the production of a switching device, the compositions of the present invention are applied to a substrate (e.g., plastic, ceramic, glass, or metal) by a known technique such as spin coating of the polymer on the substrate. For purely optical switching, a non-metallic substrate is preferred to minimize heat dissipation during switching erasure, whereas for electrical or optoelectronic switching, a metal substrate is normally required. This spin coating method is cheap, easy to use and provides uniform polymer coatings having excellent physical and mechanical properties. In contrast, the prior art TCNQ salt materials do not lend themselves to this spin coating method and instead typically are applied by a vacuum co-deposition or a solution dipping method. The solution dipping method tends to produce large crystals of TCNQ salt in non-uniform films on the substrate selected. Such non-uniform films are not desired since they tend to provide (a) low signal to noise ratios during use, (b) kpoor reproducibility of electrical response, and (c) pinhole formation which will short-out electrical devices. The vacuum co-deposition method employed in fabricating the prior art compositions is multi-step and requires the use of expensive vacuum equipment. In contrast, the compositions of the present invention when spin coated give high quality films of the desired thickness which are homogeneous and pinhole free.

In use as a switching device, the compositions of the present invention will generally be applied to a substrate in a film having a film thickness of between about 100 angstroms and about 100 microns, preferably between about 100 angstroms and about 10 microns, more preferably between about 5 and about 10 microns. Below about 100 angstroms the film thickness is expected to be insufficient to provide an adequate signal-to-noise ratio. Above about 100 microns, there is a risk of not obtaining switching completely through the film in response to an applied electrical field, thereby resulting in poorer optical contrast between switched and non-switched areas of the film.

In fabricating the switching device, the organic charge transfer salt is deposited on a supporting base material. As mentioned previously, good results are obtained with a polymeric organic charge transfer salt film thickness of 5 to 10 microns. An optional transparent protective coating may be deposited on the surface of the organic charge transfer salt film. An optical write beam is focused to a specific location on the surface of the organic charge transfer film The optical beam can be a high intensity light source or a laser source such as an argon or $CO_2$ laser focused to generate a field on the film surface. The intensity of the beam will cause the following result: (1) if the beam intensity is below the first threshold value, the polymeric organic charge transfer salt will stay in the first state; (2) if the beam intensity is increased above the first threshold, it will switch to the second state, but will switch back to the first state when the optical beam is removed; (3) if the beam intensity and/or duration is increased further, the organic charge transfer salt will switch to the second state for an indefinite period of time (so-called "memory switching"); and (4) if the optical beam width, intensity and/or duration is increased still further, a visible color change will appear. The optical intensity necessary to produce the above changes depends on the choice of the organic charge transfer salt, film thickness, and the area and intensity of the incident optical beam.

For a memory system, an optical beam with sufficient intensity can be directed by well-known optical means to other locations on the surface of the polymeric organic charge transfer salt, and can switch such other locations from the first to second state. By turning the beam "on" or "off" at a specific location a "1" or a "0" logical state can be set in the optical storage media. Alternatively, if a higher optical intensity or longer duration is used, the optical beam can be directed by well-known optical means to "draw" a visible pattern on the organic charge transfer salt.

Once data has been stored on the organic charge transfer salt storage media, a spectroscopic means can be used to determine if a particular location on the organic film is in its first or second state. Typically, a light source or a reading optical beam is directed to illuminate one of the locations with an intensity well below the first intensity threshold so that the state at the location is not disturbed. Reflected light from the selected location on the film surface is collected and filtered by the optical filter and then passed to a means for measuring the spectral intensity. The optical filter will only pass the desired spectral band. The spectral measurement means would indicate if the reflected beam that passed through the filter had a high or low amplitude. This in turn would indicate if the location was in the first or second state. The reading optical beam can be directed by well-known optical means to each of a plurality of locations on the surface of the polymeric organic charge transfer salt to determine if that particular location is in the first or second state, that is to say, if that particular location is storing a logical "1" or a logical "0".

In an alternative embodiment, the optical write beam, optical read beam, and the optical heating beam, can be generated by a single laser source by varying the intensity and duration of the illuminating beam. It is within the contemplation of the inventors that other well-known means can be used to generate the desired optical write, read, and erase beams and to direct such beams to the desired location on the organic charge transfer salt surface.

A useful optoelectronic switch of the present invention uses a polymeric organic charge transfer salt as the switching mechanism. The optoelectronic switch preferably comprises: a thin film of organic charge transfer salt deposited on a conductive substrate, a semitransparent conducting film formed over at least a portion of the organic film; a first electrode attached to said conductive substrate; and a second electrode attached to said semitransparent conducting film. As previously mentioned, the organic charge transfer salt film thickness is preferably approximately 5 to 10 microns. The semitransparent conducting film can be made from metal such as aluminum or chromium and can be evaporated or sputtered directly on the organic film to a thickness that permits partial transmission of the optical radiation.

In operation, when the optical beam exceeds the first threshold, as defined previously, the surface area illuminated by the beam will switch to the second state and the electrical impedance as measured across the two electrodes will jump from a high impedance to a low impedance. When the beam is removed or when the intensity drops below the first threshold value, the illuminated area will return to the first state (e.g., threshold switching). However, if the intensity and/or duration of the optical beam is increased, the optoelectronic switch will be switched into the second state for an indefinite period of time (i.e., bistable or memory switching). The period the switch will stay in a second state of the low impedance state depends on: (1) the choice of the organic charge transfer salt; (2) the thickness of the film; (3) the duration and intensity of the illuminating optical beam; (4) the area of the illuminating beam; and (5) the ambient or applied thermal energy. The bistable switch as described above can be returned to the first state by the application of heat energy by methods or their equivalents, as discussed below.

Several specific features of the optoelectronic switching mechanism need to be pointed out. First, the optical beam's intensity must exceed the first threshold, as defined previously, before the device switches. In this manner, an analog optical signal can be converted into a discrete digital electrical signal. Secondly, the DC biasing voltage can be used to adjust the beam intensity necessary to switch the organic charge transfer salt. As noted previously, the organic charge transfer salt will switch from the first to second states due to either an applied electric field, or an applied optical field. Therefore, by applying DC biasing voltage, the required optical intensity can be reduced. The applied DC voltage and optical beam add to generate the electrical field which causes the organic charge transfer salt to switch from the first to the second states. It is also possible in this manner to switch a bistable optoelectronic switch back to the first state by independently reducing the biasing voltage. It is within the contemplation of the inventor that both the optical beam and the DC voltage can be used in various combinations to switch the optical charge transfer salt.

The compositions of the present invention provide a capability for high-speed threshold and memory switching by changing resistance states in response to an applied electrical field. Erasure of memory states is carried out by heating to a temperature between about 120° C. and 180° C., preferably between about 140° C. and 170° C. Heating to these temperatures can be carried out by a variety of means. Preferably, a laser beam adjusted to a power below the threshold for switching is used to heat the material to effect erasure.

When using the compositions of the present invention to provide optical or optoelectronic switching, the means of providing the applied electrical field is preferably a semiconductor diode laser, desirably a gallium-/aluminum/arsenide laser, although other lasers can be used if desired such as, for example, helium neon, helium cadmium, $CO_2$, neodinium YAG, or any continuous or pulsed laser with sufficient power. Continuous wave lasers are most preferred since they have an easily-adjustable contact time.

When using the compositions of the present invention to provide electrical or electronic switching, the applied electrical field is preferably in the form of an applied electric potential using a pair of electrodes. In addition, optoelectronic switching is suitably employed by means of an applied electric potential in combination with a transparent electrode to allow laser switching of the device.

The compositions of the present invention are expected to meet applicable switching design requirements by providing threshold or memory switching within a nanosecond to microsecond time frame.

While several features of the present invention relate to optoelectronic switches and optical and electrical memory devices, it is to be understood that the above-mentioned optical or electrical switching function of the organic charge transfer salts can have application in other optical and electrical devices and optically sensitive apparatus.

The following examples are intended to illustrate, but in no way limit, the scope of the present invention.

EXAMPLE 1

Preparation of Polymer With Pendant TCNQ Organic Charge Transfer Moieties

This reaction was conducted in a glove box. The concentration of water vapor in the system was less than 10 ppm. All glassware was previously dried and all solvents and reactants were rigorously dried.

2-(2'-Hydroxyethoxy)-5-bromo-7,7,8,8-tetracyanoquinodimethane (prepared according to the procedure of Hertlet, *Journal of Organic Chemistry*, 41 (8), p. 1412 (1976)), in an amount of 0.3505 grams, was dissolved in 6 ml of N,N-dimethylacetamide in a 50 ml beaker. This solution was then transferred to a 25×200 mm test tube containing a small Teflon coated magnetic stirrer. Two ml of N,N-dimethylacetamide was used to rinse 50 ml beaker and an additional 2 ml of N,N-dimethylacetamide was used to rinse down the sides of the test tube. (Thus, total of 10 ml of N,N-dimethylacetamide was used.) The test tube was then fitted with a rubber septum and drying tube.

The resulting solution was then frozen by placing the test tube into one rubber glove in the glove box and immersing the glove outside of the glove box in a mixture of dry ice and acetone. The test tube was maintained in the mixture until the solution solidified.

Poly(acryloyl chloride) (25 percent solids in dioxane, Polyscience), in an amount of 0.3240 grams, was weighed out in a vial and added to the test tube containing the frozen mixture of N,N-dimethylacetamide and the hydroxy TCNQ derivative. Dioxane, in an amount of 3 ml, was then used to rinse the vial and the sides of the test tube. The tube was refitted with the septum and the drying tube.

The test tube was quickly removed from the glove box and placed in a temperature controlled cooling bath at 0° C., with constant stirring for 137 hours.

At the end of the 137 hours, the contents of the test tube were poured into a beaker containing 250 ml of methanol. The mixture was stirred for one hour. The solution was then filtered through a fine glass fritted filter. A reddish-brown solid was recovered which was washed three times with 100 ml aliquots of fresh methanol. The reddish-brown solid was removed from the funnel and placed into a vacuum desiccator to remove any residual methanol. The solid was identified by conventional analytical techniques to be the pendant TCNQ polymer in an amount of 0.155 grams.

EXAMPLE 2

Optical Switching of Polymer With Pendant TCNQ Moieties

Approximately 10 mg of the pendant TCNQ-containing polymer prepared in EXAMPLE 1 was dissolved in 0.5 ml of N,N-dimethylformamide.

The silver salt of this polymer was then formed. The preparation of the silver salt of this polymer was accomplished as follows:

A film 5–10 cm thick was poured from the above solution onto a clean silver substrate. Heat was applied to about 120° C. to expedite salt formation and to remove any residual N,N-dimethylformamide. This green film was then exposed to a beam from a helium-cadmium laser operating at 12 milliwatts focused through a 40X microscope objective. An orange line was drawn onto the green film by this beam which changed back to a green color upon heating the film in an oven at 165° C. for 10 minutes.

Another sample of silver salt was prepared by the following alternate and preferred method using the same polymer:

Approximately 10 mg of the pendant TCNQ-containing polymer prepared in EXAMPLE 1 was dissolved in 15 ml of N,N-dimethylformamide.

A film was made by dropping the above solution onto a glass substrate. The solvent was removed by evaporation in a vacuum desiccator.

The silver salt of this polymeric film was then prepared by dipping the film into a solution of acetonitrile saturated with lithium iodide. The film turned green immediately. The film was then removed and rinsed with fresh acetonitrile. The film was then heated to 120° C. and maintained at that temperature for three minutes. This heating step was found to enhance the overall thermal stability of the finished material.

After heating, the film was then immersed into a solution of acetonitrile saturated with silver nitrate. The film immediately turned a darker green color. The film was then rinsed with fresh solvent. Any residual solvent was removed from the film when it was placed in a vacuum desiccator.

The above green film was then exposed to a beam from a helium-cadmium laser operating at 12 milliwatts focused through a 40X microscope objective. An orange line was drawn onto the green film by this beam which changed back to a green color upon heating the film in an oven at 165° C. for 10 minutes.

The above results demonstrate the excellent memory writing and thermal erasure properties of this polymeric pendant TCNQ material.

EXAMPLE 3

Electrically-Induced Switching of Polymer With Pendant TCNQ Moieties

An electrically-induced switching device was fabricated using the pendant TCNQ-containing polymer prepared in EXAMPLE 1. A film of the silver salt of the pendant TCNQ polymer was formed on a clean silver substrate in accordance with the procedure given in EXAMPLE 2. This was then heated to improve salt formation and to remove any residual solvent. The film was also placed in a vacuum desiccator to remove any final traces of the solvent. The top surface of the film was masked so that only a ⅛ inch diameter circle was left exposed. The film was then placed into a vacuum chamber and an aluminum top electrode was evaporated onto the exposed area of the pendant TCNQ polymer film. A copper wire was soldered to the bottom of the silver substrate and a copper wire was attached to the top electrode using conducting silver paste. When an electric field of about 2 volts was applied between the two electrodes (which exceeded the threshold), the device switched from a high impedance state to a low impedance state, as evidenced by the slope of the current-potential curve for this material.

EXAMPLE 4

Preparation of Pendant TCNQ-Containing Polymer by Alternate Method (A)

Preparation of 3-TCNQ-Propanoyl Chloride

3-TCNQ-propanic acid, 82.9 mg, (prepared according to Baghdadchi and Panetta, *Journal of Organic Chemistry*, 48, 3852 (1983)) was added to 20 ml of thionyl chloride and stirred to dissolve. The solution was then heated to reflux and refluxed overnight. The thionyl chloride was removed by distilling under reduced pressure. An orange solid remained as a residue. Infrared spectroscopy confirmed the identity of the product.

(B)

Preparation of Pendant TCNQ Polymer From 3-TCNQ-Propanoyl Chloride and Polyvinyl Alcohol Polyvinylalcohol, 0.1015 g, (Air Products Vinol 523) and 5 ml of N-methyl pyrrolidone (freshly fractionally distilled, Aldrich) were placed in a test tube sealed with a septum to which a drying tube had been added. A stirring bar was added, and the mixture was heated gently and stirred until dissolution of the polyvinyl alcohol was complete. 3-TCNQ-propanoyl chloride, 0.017 g, (prepared as outlined in EXAMPLE 3), was added after the polyvinyl alcohol-N-methyl pyrrolidone solution had been cooled to ice temperatures. The reaction mixture was stirred in an ice bath for approximately 48 hours and then stirred at room temperature for another 48 hours. The reaction mixture was poured into approximately 80 ml of acetonitrile and a solid precipitated. The pale green colored solid was collected by filtration and washed with acetonitrile repeatedly. The solid was then dried in a vacuum desiccator. The dried produce weighed 0.0843 g. UV-Visible spectroscopy indicated the presence of TCNQ units.

What is claimed is:

1. A switching device responsive to an electrical field comprising:
   (a) a polymer containing an organic charge transfer salt, wherein the salt comprises a polymer-bound organic electron acceptor and an electrostatically-bound electron donor said salt having a switching capability in response to an electrical field, and wherein said polymer has an empirical structural formula represented by:

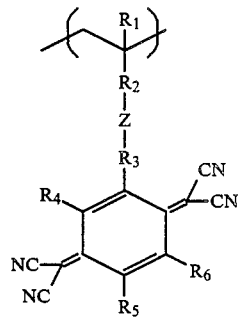

wherein
   $R_1 =$ H or $CH_3$,
   $R_2$ and $R_3$ are the same or different organic radical or substituted organic radical linking groups having up to 6 carbon atoms, and
   $Z=$

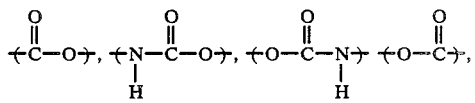

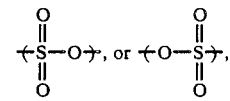

and wherein $R_4$, $R_5$, and $R_6$ are the same or different groups selected from the group consisting of hydrogen, bromine, iodine, chlorine, fluorine, alkyl, and alkoxy groups having up to 6 carbon atoms, and
   (b) a source of an electrical field to cooperate with said salt to activate said switching capability.

2. The device of claim 1 wherein said salt switches between a first charge state having a relatively high electrical impedance and a second charge state having a relatively lower electrical impedance in response to said electrical field.

3. A switching device connectable and responsive to an electrical field comprising:
   (a) a base polymer having the empirical structural formula:

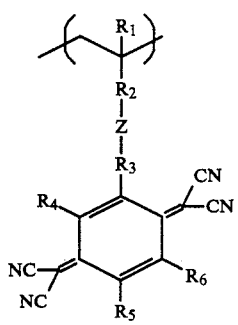

wherein $R_1$ = H or $CH_3$, $R_2$ and $R_3$ are the same or different organic radial or substituted organic radical linking groups having up to 6 carbon atoms, and

Z =

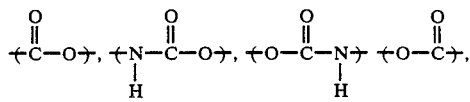

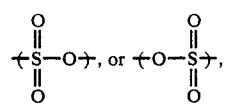

and wherein $R_4$, $R_5$, and $R_6$ are the same or different groups selected from the group consisting of hydrogen, bromine, iodine, chlorine, fluorine, alkyl, and alkoxy groups having up to 6 carbon atoms, and (b) an organic charge transfer salt prepared from said base polymer, said salt comprising a polymer-bound organic electron acceptor and an electrostatically-bound electron donor, said salt providing a switching capability in response to an electrical field.

4. The device of claim 3 wherein said polymer-bound organic electron acceptor is selected from the group consisting of TCNQ or derivatives thereof, and mixtures thereof.

5. The device of claim 3 wherein said electrostatically-bound electron donor is a metal selected from the group consisting of copper, silver, cerium, and mixtures thereof.

* * * * *